US008460765B2

(12) United States Patent
Feldman-Peabody

(10) Patent No.: US 8,460,765 B2
(45) Date of Patent: Jun. 11, 2013

(54) METHODS FOR FORMING SELECTIVELY DEPOSITED THIN FILMS

(75) Inventor: Scott Daniel Feldman-Peabody, Golden, CO (US)

(73) Assignee: Primestar Solar, Inc., Arvada, CO (US)

( * ) Notice: Subject to any disclaimer, the term of this patent is extended or adjusted under 35 U.S.C. 154(b) by 381 days.

(21) Appl. No.: 12/825,815

(22) Filed: Jun. 29, 2010

(65) Prior Publication Data

US 2011/0315209 A1 Dec. 29, 2011

(51) Int. Cl.
*C23C 16/48* (2006.01)
*C23C 16/04* (2006.01)

(52) U.S. Cl.
USPC ............ 427/595; 427/596; 427/597; 427/165

(58) Field of Classification Search
USPC .................................. 427/595, 596, 597, 165
See application file for complete search history.

(56) References Cited

U.S. PATENT DOCUMENTS

| | | | | |
|---|---|---|---|---|
| 4,640,002 | A * | 2/1987 | Phillips et al. ................... | 438/12 |
| 5,810,945 | A * | 9/1998 | Stutzmann et al. .............. | 438/96 |
| 6,137,048 | A * | 10/2000 | Wu et al. ......................... | 136/260 |
| 7,341,925 | B2 | 3/2008 | Kelly et al. | |
| 8,119,513 | B1 * | 2/2012 | Korevaar et al. ............... | 438/603 |
| 8,187,912 | B2 * | 5/2012 | Lucas et al. ..................... | 438/86 |
| 8,207,009 | B2 * | 6/2012 | Frey ................................. | 438/80 |
| 8,329,496 | B2 * | 12/2012 | Ghandour ........................ | 438/68 |
| 2006/0207644 | A1* | 9/2006 | Robinson et al. .............. | 136/243 |
| 2007/0125905 | A1* | 6/2007 | Fukuda .......................... | 244/23 A |
| 2007/0173051 | A1* | 7/2007 | Nelson et al. .................. | 438/609 |
| 2008/0053522 | A1* | 3/2008 | Basol ............................. | 136/256 |
| 2008/0286448 | A1* | 11/2008 | Elam et al. ..................... | 427/109 |
| 2009/0104577 | A1* | 4/2009 | Campbell et al. ............. | 431/289 |
| 2009/0120496 | A1* | 5/2009 | Cording et al. ................ | 136/256 |
| 2011/0262712 | A1* | 10/2011 | Little et al. ..................... | 428/172 |
| 2012/0028404 | A1* | 2/2012 | Frey ................................ | 438/80 |
| 2012/0192924 | A1* | 8/2012 | Basol ............................. | 136/249 |

OTHER PUBLICATIONS

Kakehi, Yoshiharu, et al., "Properties of copper-scandium oxide thin films prepared by pulsed laser deposition". Thin Solid Films 445 (2003) pp. 294-298.*
Wu, X., et al., "CdS/CdTe Thin-Film Devices Using a Cd2SnO4 Transparent Conductive Oxide". CP394, NREL/SNL Photovoltaics Program Review, edited by C.Edwin Witt et al., AIP Press, New York, 1997, pp. 693-702.*
Niemegeers, Alex, et al., "Effects of the Au/CdTe back contact on IV and CV characteristics of Au/CdTe/CdS/TCO solar cells". J. Appl. Phys. 81 (6), Mar. 15, 1997, pp. 2881-2886.*
Oladeji, Isaiah O., et al., "Metal/CdTe/CdS/Cd1-xZnxS/TCO/glass: A new CdTe thin film solar cell structure". Solar Energy Materials and Solar Cells 61 (2000) pp. 203-211.*

* cited by examiner

*Primary Examiner* — Bret Chen
(74) *Attorney, Agent, or Firm* — Dority & Manning, P.A.

(57) ABSTRACT

A method for selectively depositing a thin film structure on a substrate is provided. The method includes providing a process gas to a surface of the substrate and directing concentrated electromagnetic energy from a source of energy to at least a portion of the surface. The process gas is decomposed onto the substrate to form a selectively deposited thin film structure.

15 Claims, 11 Drawing Sheets

METHODS FOR FORMING SELECTIVELY DEPOSITED THIN FILMS

FIELD OF THE INVENTION

The present invention is directed to thin film devices having selectively deposited thin film structures and methods for forming selectively deposited thin films.

BACKGROUND OF THE INVENTION

Energy demand is constantly increasing. As the energy demand increases, sources alternative to fossil fuel energy sources increase in importance. One such alternative energy source is solar energy. Generally, solar energy is produced by converting radiation (for example, sunlight) into electricity which may be stored or transmitted through electrical power grids.

The deposition and isolation of the thin film components and structures typically requires carefully ordered steps of scribing and deposition. In known processes, the deposition and isolation of thin film components and structures are accomplished utilizing complicated, energy intensive and expensive processes, such as photolithography.

Transparent conductive oxides (TCOs) are used as electrically conductive layers for the electrical contact of thin film photovoltaic (PV) cells in a PV module on a side that receives sunlight during operation. During processing, interconnections between cells are provided using thin film application methods and scribing techniques, using chemicals or lasers to selectively remove material. As a result of the processing and the structures forming the interconnections, the area of interconnection between cells may be a "dead area," or an area that does not produce electricity when exposed to light.

A method for producing selectively deposited structures for use with thin film devices. In addition, it is needed to have thin film devices having decreased resistivity/increased conductivity in the interconnection between cells, without affecting the active area of the PV cells would be welcome in the art.

BRIEF DESCRIPTION OF THE INVENTION

In one embodiment, a method for selectively depositing a thin film structure on a substrate that includes providing a process gas to a surface of the substrate and directing concentrated electromagnetic energy from a source of energy to at least a portion of the surface. The process gas is decomposed onto the substrate to form a selectively deposited thin film structure.

Another embodiment includes a thin film device. The thin film device includes a substrate and a selectively deposited thin film structure on the substrate. The selectively deposited thin film structure includes a decomposed process gas.

Still another embodiment includes an apparatus for forming a selectively deposited thin film structure. The apparatus includes a chamber for containing a process gas, a source of energy capable of directing concentrated electromagnetic energy to the surface of a substrate and a source of the process gas capable of providing the process gas to the substrate. The source of energy locally raises the temperature of a substrate positioned in the chamber in the presence of the process gas. The temperature provided is sufficient to decompose the process gas to form a selectively deposited thin film structure.

BRIEF DESCRIPTION OF THE DRAWINGS

Wherever possible, the same reference numbers will be used throughout the drawings to represent the same parts.

DETAILED DESCRIPTION OF THE INVENTION

Provided is an apparatus and method for producing selectively deposited structures for use with thin film devices. The apparatus and method disclosed provides thin film devices having decreased resistivity/increased conductivity in the interconnection between cells, substantially without affecting the active area of the PV cells.

In the disclosure, when a layer is being described as "adjacent," "on" or "over" another layer or substrate, it is to be understood that the layer can either be directly in contact or that another layer or feature can intervene. In addition, "dead area" includes an area across the photovoltaic (PV) module that does not produce electricity when exposed to light. For example, a dead area may include an area having no material (for example, an air gap) that produces electricity or may include electricity producing layers that are electrically isolated. Conversely, "active area" includes an area across the PV module that produces electricity when exposed to light and is connectable to a load. When a layer or material is described as "transparent," it is to be understood that a transparent film includes materials that are fully or partially transparent to light at some or all wavelengths found in natural sunlight. When a layer or material is described as "electrically conductive," "conductive" or as a "conductor" it is to be understood that the material permits the flow of electricity with or without electrical resistance.

Figure 1:
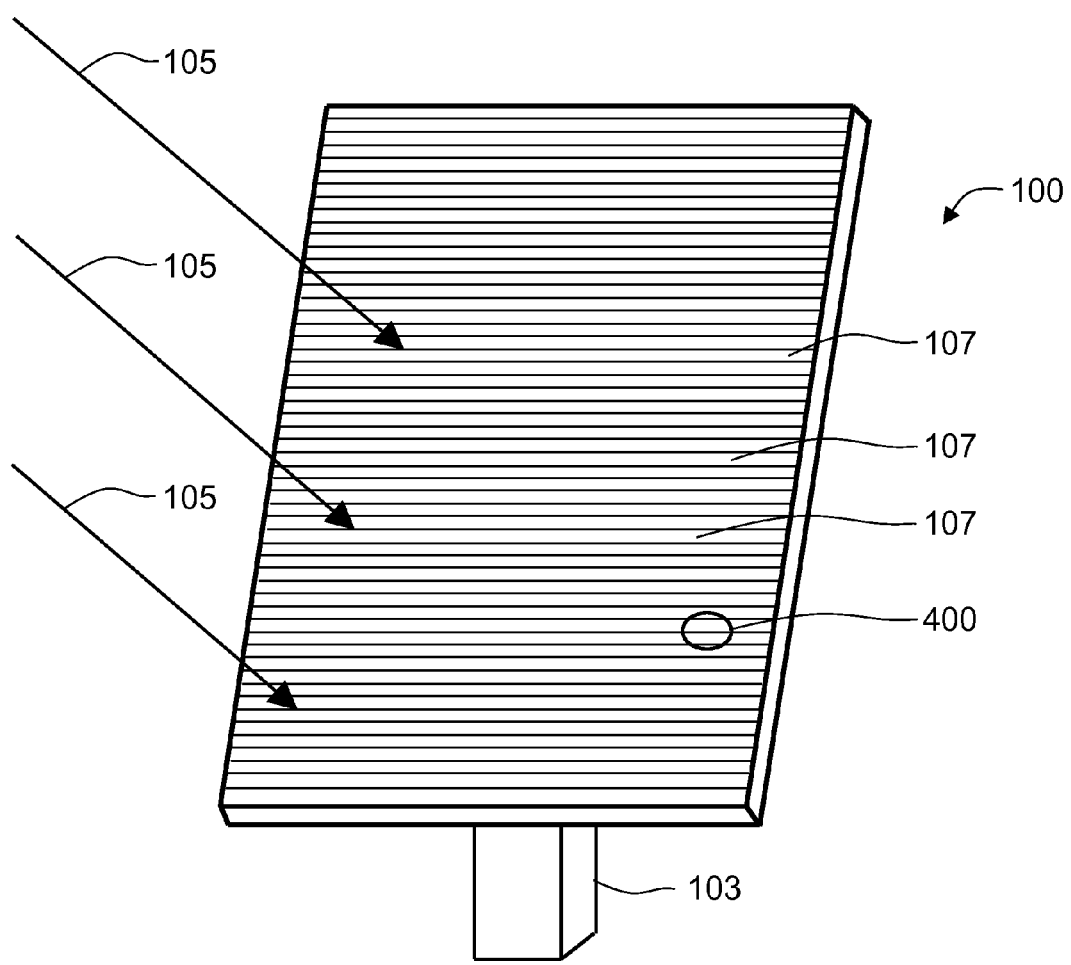
FIG. 1 shows a thin film module mounted on a base according to the disclosure.

FIG. 1 shows a thin film PV module 100 mounted on a base 103. PV module 100 is arranged to receive light 105. PV module may be divided into a plurality of cells 107 that are arranged in series. The cells 107 may be divided by spaces, non-conductive material and/or other structures separating circuits. For example, cells 107 may be isolated from each other by scribes formed by laser scribing. When the PV module 100 is exposed to light 105, electricity is produced. The disclosure is not limited to the arrangement shown and may include other mounting arrangements and/or cells 107. For example, the cells 107 may be oriented along the long dimension of module 100 instead of the short dimension of module 100. One embodiment of the disclosure includes a thin film CdTe photovoltaic (PV) module. Such modules are used to produce solar electricity in numerous applications, for example, large ground-mounted systems and rooftop systems on commercial and residential buildings. While the PV module may be a thin film structure, the method and system of the present disclosure may also be utilized to form gridline front contacts on crystalline solar cells such as, Si or Group III-V-based concentrators (e.g., GaAs, and GaInP).

Figure 2:
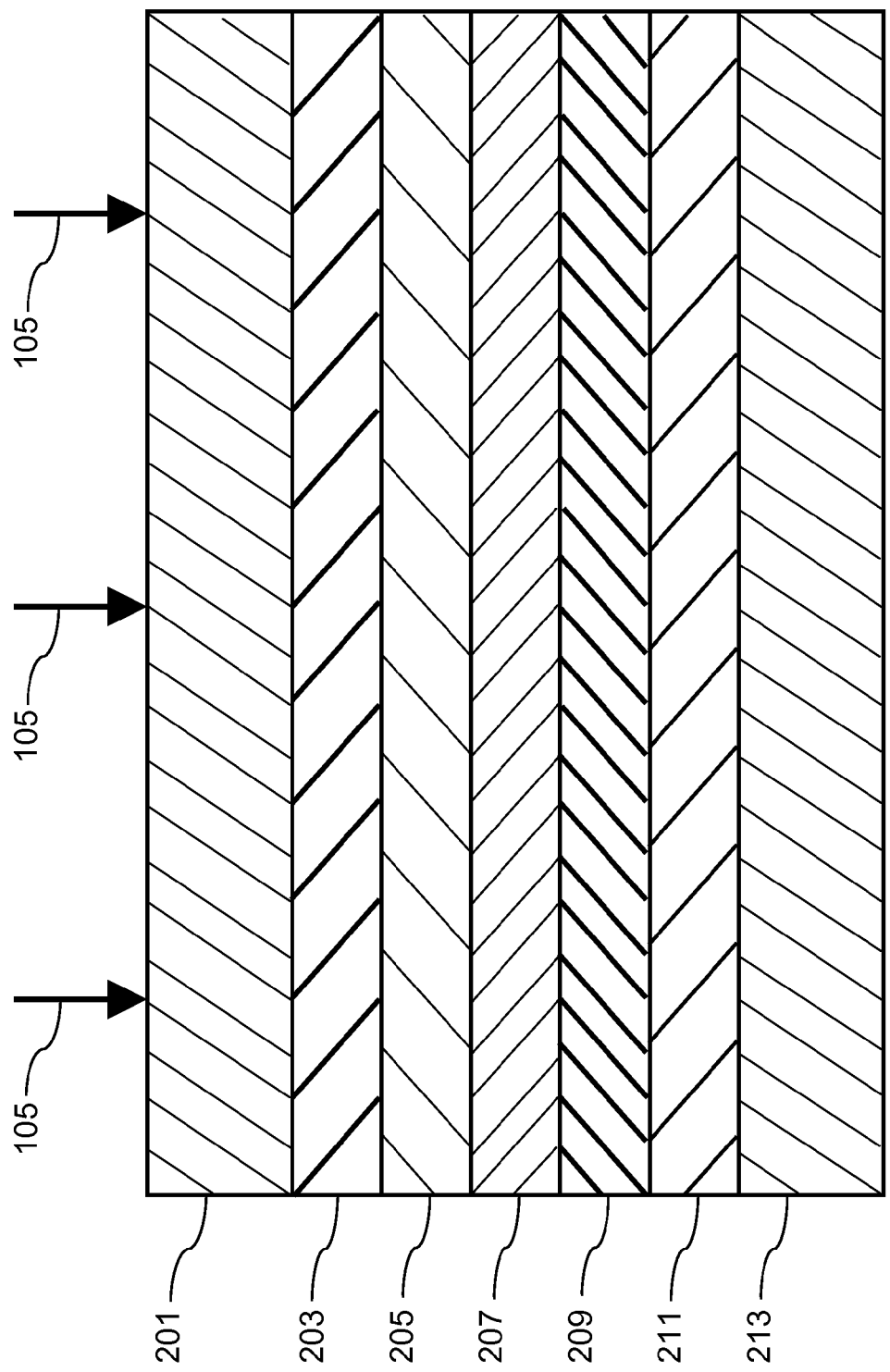
FIG. 2 is a diagram of a layer system making up cells of a module according to the disclosure.

FIG. 2 is a diagram of the layer system forming cells 107 of PV module 100. The layers of cell 107 include a superstrate 201, a first conductive layer 203, a buffer layer 205, a first semiconductor layer 207, a second semiconductor layer 209, a second conductive layer 211 and an encapsulating glass 213. The layers of the cell 107 are arranged to generate and conduct electricity in a usable form when exposed to light 105.

The superstrate 201 is a sheet of high transmission glass onto which thin films are grown. The superstrate receives the light 105 (see FIG. 1) prior to the underlying layers. Superstrate 201 may be standard soda-lime glass, a high-transmission, low-iron float glass or any other suitable glass material having a high transmission rate for light 105. In another embodiment, the superstrate 201 may also be a high transmission borosilicate glass.

After the light 105 passes through superstrate 201, at least a portion of the light passes through first conductive layer 203. First conductive layer 203 may be a transparent conductive oxide (TCO), which permits transmission of light 105 with little or no absorption. The first conductive layer 203 is also electrically conductive, which permits electrical conduction to provide the series arrangement of cells 107. The first conductive layer 203 is formed to a thickness that provides electrical conductivity, but permits the passage of at least some light 105. While not so limited, in one embodiment, the first conductive layer 203 may be formed to a thickness of about 0.1-0.7 µm or 0.1-0.4 µm or 0.2-0.3 µm or 0.2-1.0 µm or 0.3-0.7 µm or 0.35-0.55 µm of tin oxide. One suitable material for use in formation of the first conductive layer 203 may be fluorine-doped tin oxide.

Other suitable conductive layers may include, for example, stoichiometric cadmium stannate (nominally $Cd_2SnO_4$), aluminum-doped zinc oxide, indium tin oxide, doped indium oxide, zinc or cadmium doped tin oxide, copper aluminum oxides or another compound of cadmium tin oxide (such as $CdSnO_3$). First conductive layer 203 may permit passage of light 105 through to the semiconductor layers (e.g., first semiconductor layer 207 and second semiconductor layer 209) while also functioning as an ohmic electrode to transport photogenerated charge carriers away from the light absorbing material.

A buffer layer 205 is adjacent to first conductive layer 203. Buffer layer 205 is more electrically resistive and protects the layers of cell 107 from chemical interactions from the glass and/or interactions which might be incurred from subsequent processing. Inclusion of buffer layer 205 reduces or prevents electrical or other losses that may take place across cell 107 and across module 100. Suitable materials for buffer layer 205 may include tin oxide containing materials, such as, but not limited to, zinc doped tin oxide, a mixture of zinc and tin oxides (for example zinc tin oxide having 0.5 to 33 atomic % Zn), zinc stannate, gallium oxide, aluminum oxide, silicon oxide, indium oxide, cadmium oxide and any other suitable barrier material having more electrical resistivity than first conductive layer 203 and the capability of protecting the layers of the cell from interactions from the glass or interactions from subsequent processing. In addition, the inclusion of buffer layer 205 permits the formation of a first semiconductor layer 207 which permits photon passage while maintaining a high quality junction capable of generating electricity. In certain embodiments, buffer layer 205 may be omitted or substituted by another material or layer. In one embodiment, buffer layer 205 includes a combination of ZnO and $SnO_2$. For example, in one embodiment, the buffer layer 205, while not so limited, may be formed to a thickness of up to about 1.5 microns or about 0.8-1.5 microns and may include ZnO and $SnO_2$ having about 1 to 22 wt % Zn and Zn to Sn ratios from about 1:60 to 1:2 or from about 1:5 to about 1:18 or about 1:10.

As shown in FIG. 2, first semiconductor layer 207 is adjacent to buffer layer 205 and receives light 105 subsequent to superstrate 201, first conductive layer 203 and buffer layer 205. First semiconductor layer 207 includes a wide bandgap n-type semiconductor material. Suitable semiconductor material for first semiconductor layer 207 may include, but is not limited to CdS, CdO, AnSe, GaN, $In_2O_2$, CdSnO, ZnS, CdZnS, ZnSe or other suitable n-type semiconductor material. In one embodiment the first semiconductor layer 207 includes CdS. While not so limited, first semiconductor layer 207 may have a thickness from about 0.01 to about 0.12 µm or 0.03 to 0.1 µm or 0.05 to 0.9 µm or about 0.08 µm. First semiconductor layer 207 may be formed by chemical bath deposition or by sputtering. First semiconductor layer 207 preferably has a smooth surface and is substantially uniform and free of impurities and pinholes.

First semiconductor layer 207 forms the junction with second semiconductor layer 209 to create the photovoltaic effect in cell 107, allowing electricity to be generated from light. Second semiconductor layer 209 may include, for example, Cd, CdTe or other p-type semiconductor material. When second semiconductor layer 209 is provided with first semiconductor layer 207 a photovoltaic effect results when first semiconductor layer 207 and second semiconductor layer 209 are excited by light 105.

As shown in FIG. 2, second semiconductor layer 209 is adjacent to first semiconductor layer 207. Second conductive layer 211 is positioned adjacent to the second semiconductor layer 209 and provides an electrically conductive material that is capable of conducting electricity formed from the combination of the first semiconductor layer 207 and second semiconductor layer 209 when excited by light 105. Although FIG. 2 shows an arrangement of two layers for first semiconductor layer 207 and second semiconductor layer 209, any number of layers, including interstitial layers, may be utilized to provide the photovoltaic effect.

Second conductive layer 211 may be fabricated from any suitable conductive material and combinations thereof. For example, suitable materials may include, graphite, metallic silver, nickel, copper, aluminum, titanium, palladium, chromium, molybdenum, alloys of metallic silver, nickel, copper, aluminum, titanium, palladium, chromium, and molybdenum and any combination thereof. In one embodiment, second conductive layer 211 may be a combination of graphite, and nickel and aluminum containing alloys.

Encapsulating glass 213 may be adhered adjacent to second conductive layer 211. Encapsulating glass 213 may be a rigid structure suitable for use with the thin films of cell 107. Encapsulating glass 213 may be the same material as superstrate 201 or may be different. Additionally or alternatively, although not shown in FIG. 2, encapsulating glass 213 may include openings or structures to permit wiring and/or connection to cell 107.

Module 100 and individual cells 107 may include other layers and structures not shown in FIG. 2. For example, superstrate 201 and/or encapsulating glass 213 may include a barrier coating or other structure to reduce or prevent diffusion of impurities into the layers. Additionally or alternatively, encapsulating glass 213 may include an adherent layer to adhere encapsulating glass 213 to the layers. Additional structures that may be present in module 100 and/or cells 107 include, for example, scribes, bussing structures, external wiring, and various conventional components useful with thin film and/or PV structures.

Figure 3:
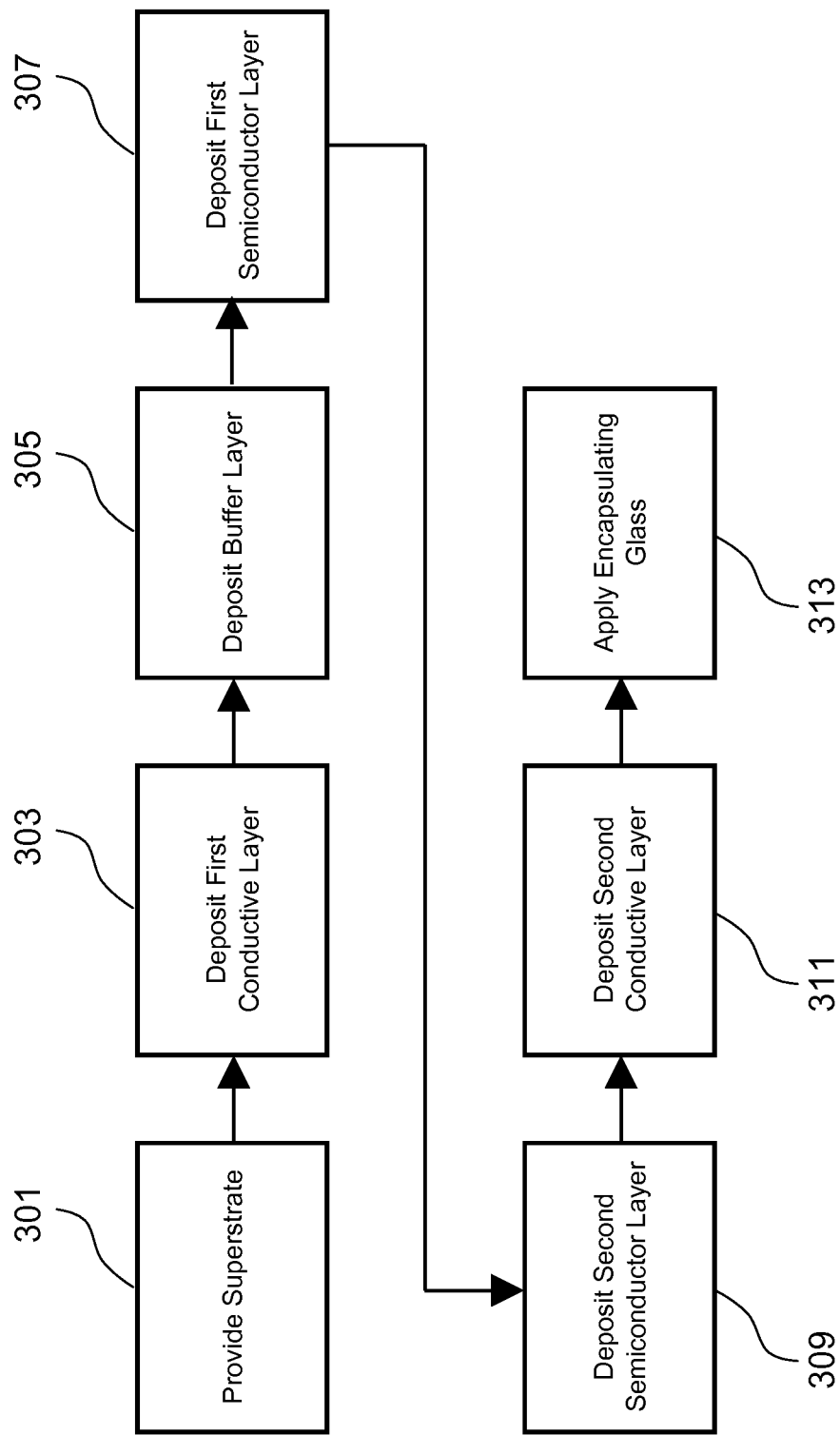
FIG. 3 is a process flow diagram of an exemplary process for forming a module according to the disclosure.

FIG. 3 shows a process flow diagram for an exemplary process 300 for forming module 100. Process 300 includes the formation of a thin film stack forming cell 107, wherein the films or layers are formed on superstrate 201 (shown from the top down in FIG. 2).

As shown in the flow diagram of FIG. 3, superstrate 201 is provided (box 301). Superstrate 201 may be fabricated from any suitable material capable of receiving thin films for use as PV cells and sufficiently transparent to allow transmission of light 105.

Subsequent to providing superstrate 201, first conductive layer 203 is deposited onto superstrate 201 (box 303). First conductive layer 203 is electrically conductive, which permits electrical conduction to provide the series arrangement of cells 107. While not so limited, in one embodiment, first conductive layer 203 may be formed to a thickness of about 0.1-0.7 µm or 0.1-0.4 µm or 0.2-0.3 µm or 0.2-1.0 µm or 0.3-0.7 µm or 0.35-0.55 µm of tin oxide. Other suitable conductive layers may include fluorine-doped stoichiometric cadmium stannate (nominally $Cd_2SnO_4$), aluminum-doped zinc oxide, indium tin oxide, doped indium oxide, zinc or cadmium doped tin oxide, copper aluminum oxides or another compound of cadmium tin oxide (such as $CdSnO_3$). First conductive layer 203 can be formed, for example, by direct current (DC) or radio frequency (RF) sputtering. In one embodiment, first conductive layer 203 is a layer of tin oxide substantially amorphous $Cd_2SnO_4$ that is deposited with chemical vapor deposition (CVD) onto superstrate 201. Such CVD can be performed from tin and fluorine containing precursors in an oxygen containing environment. Once first conductive layer 203 is applied, buffer layer 205 may be applied to first conductive layer 203 (box 305). In one embodiment, buffer layer 205 may be formed, for example, by sputtering. In one example, buffer layer 205 may be formed by sputtering from a hot-pressed target containing, for example, primarily Sn and 1-22 wt % Zn by weight or stoichiometric amounts of about 67 mol % $SnO_2$ and about 33 mol % ZnO onto first conductive layer 203. When deposited by sputtering, the zinc tin oxide material for buffer layer 205 may be substantially amorphous. Buffer layer 205 may have a thickness of between about 800 and 3,000 Angstroms, or between about 900 and 1,500 Angstroms, in order to have desirable mechanical, optical, and electrical properties. Buffer layer 205 may have a wide optical bandgap, for example about 3.3 eV or more, in order to permit the transmission of light 105.

First semiconductor layer 207 is deposited on buffer layer 205 (box 307). In one embodiment, first semiconductor layer 207 may be formed, for example, by chemical bath deposition or sputtering. While not so limited, first semiconductor layer 207 may be deposited to a thickness of from about 0.01 to about 0.12 µm or 0.03 to 0.1 µm or 0.05 to 0.9 µm or about 0.08 µm. One suitable material for use as first semiconductor layer 207 may include CdS. A suitable thickness for a CdS layer may range from about 500 to 800 Angstroms. First semiconductor layer 207 forms the junction with second semiconductor layer 209 to create the photovoltaic effect in cell 107, allowing cell 107 to produce electricity from light 105.

After the formation of first semiconductor layer 207, second semiconductor layer 209 is deposited on first semiconductor layer 207 (box 309). Second semiconductor layer 209 may include Cd, CdTe or other p-type semiconductor material. Second semiconductor layer 209 may be deposited by diffusive transport deposition, sputtering and other suitable deposition method for depositing p-type semiconductor thin film material.

Subsequent to the formation of the second semiconductor layer 209, second conductive layer 211 is formed (box 311). Second conductive layer 211 may be fabricated from any suitable conductive material. Second conductive layer 211 may be formed by sputtering, electrodeposition, screen printing, physical vapor deposition (PVD), chemical vapor deposition (CVD), and/or spraying. In one embodiment, second conductive layer 211 is a combination of graphite that is screen printed onto the surface and nickel and aluminum alloy that is sputtered onto the surface.

All the sputtering steps described above may be magnetron sputtering at ambient temperature under highly pure atmospheres. For example, a zinc tin oxide buffer layer 205 may be formed by DC sputtering. However, other deposition processes may be used, including higher temperature sputtering, electrodeposition, screen printing, physical vapor deposition (PVD), chemical vapor deposition (CVD) or spraying. In addition, the processing may be provided in a continuous line or may be a series of batch operations. When the process is a continuous process, the sputtering or deposition chambers are individually isolated and brought to coating conditions during each coating cycle, then repeated.

Once second conductive layer 211 is formed, encapsulating glass 213 is adhered to second conductive layer 211 (box 313). Encapsulating glass 213 may be a rigid material suitable for use with thin film structures and may be the same material or different material than superstrate 201. Encapsulating glass 213 may be adhered to second conductive layer 211 using any suitable method. For example, encapsulating glass 213 may be adhered to second conductive layer 211 using an adhesive or other bonding composition or process.

Although not shown in FIG. 3, other processing steps may be included in process 300 for forming module 100 and cells 107. For example, cleaning, etching, doping, dielectric, and/or other selective insulative material deposition may be utilized. Additionally or alternatively, formation of interstitial layers, scribing, heat treatments, and/or wiring may be utilized. Wiring and/or bussing devices may be provided to complete the PV circuit (for example, forming cells 107 in series arrangement) and to provide connectivity of the PV circuit to a load or other external device.

Scribing may be utilized to form the interconnections between the layers and isolated cells and/or layers of the thin film stack. Scribing may be accomplished using any known technique for scribing and/or interconnecting the thin film layers. In one embodiment, scribing is accomplished using a laser directed at one or more layers from one or more directions. One or more laser scribes may be utilized to selectively remove thin film layers and to provide interconnectivity and/or isolation of cells 107. In one embodiment, the scribes and layer deposition are accomplished to interconnect and/or isolate cells 107 to provide a PV circuit having cells 107 in a series of electrical arrangements.

Figure 4:
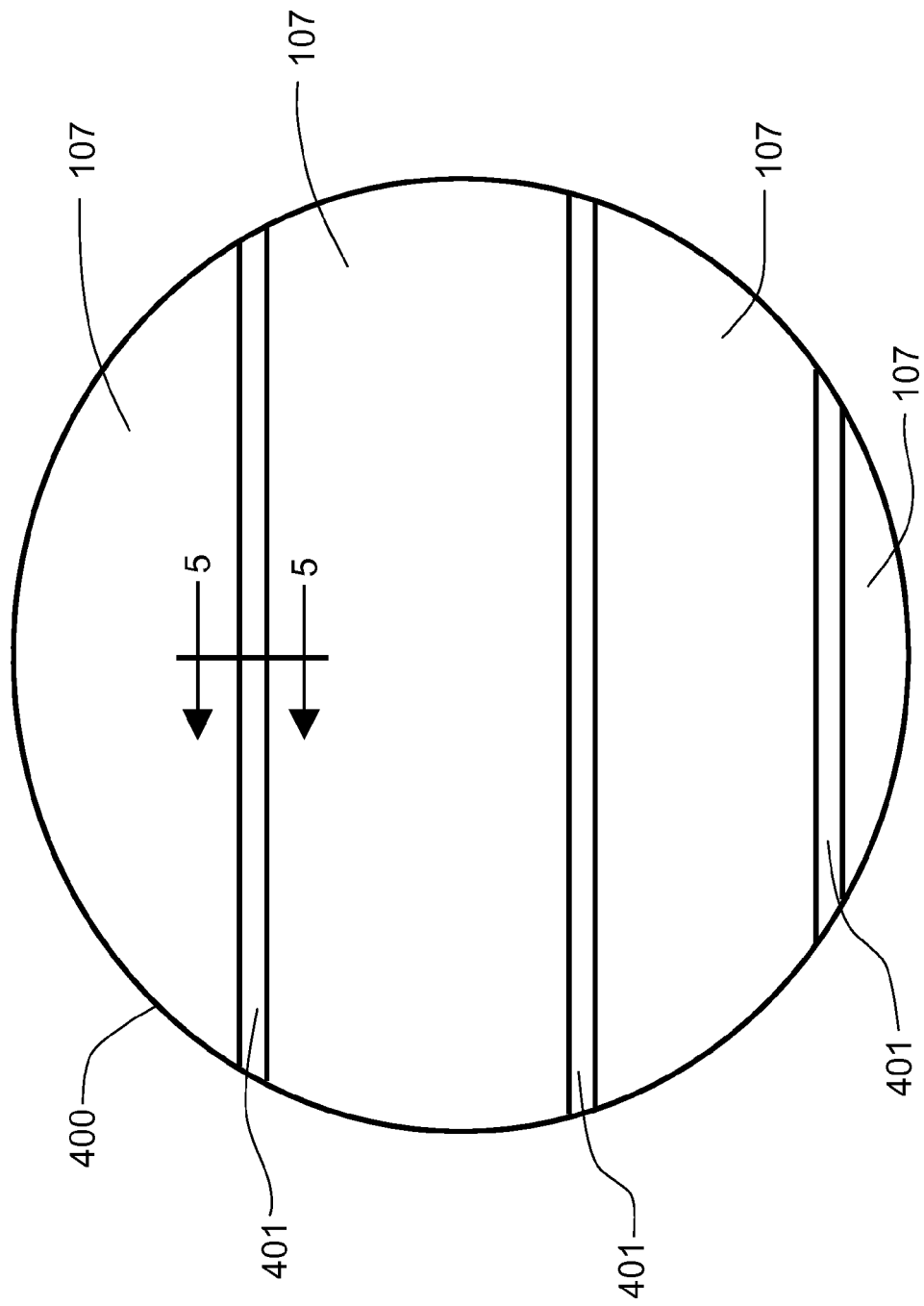
FIG. 4 shows an enlarged area 400 of the thin film module of FIG. 1.

FIG. 4 shows an enlarged area 400 from FIG. 1. As shown in FIG. 4, cells 107 are divided by interconnections 401. The interconnections 401 may be any suitable structures for forming the electrical interconnection between cells 107. Suitable structures may include spacing or scribes, dielectric material, insulating material, wiring, conductive material and/or other suitable material for forming the electrical connection between cells 107.

Figure 5:
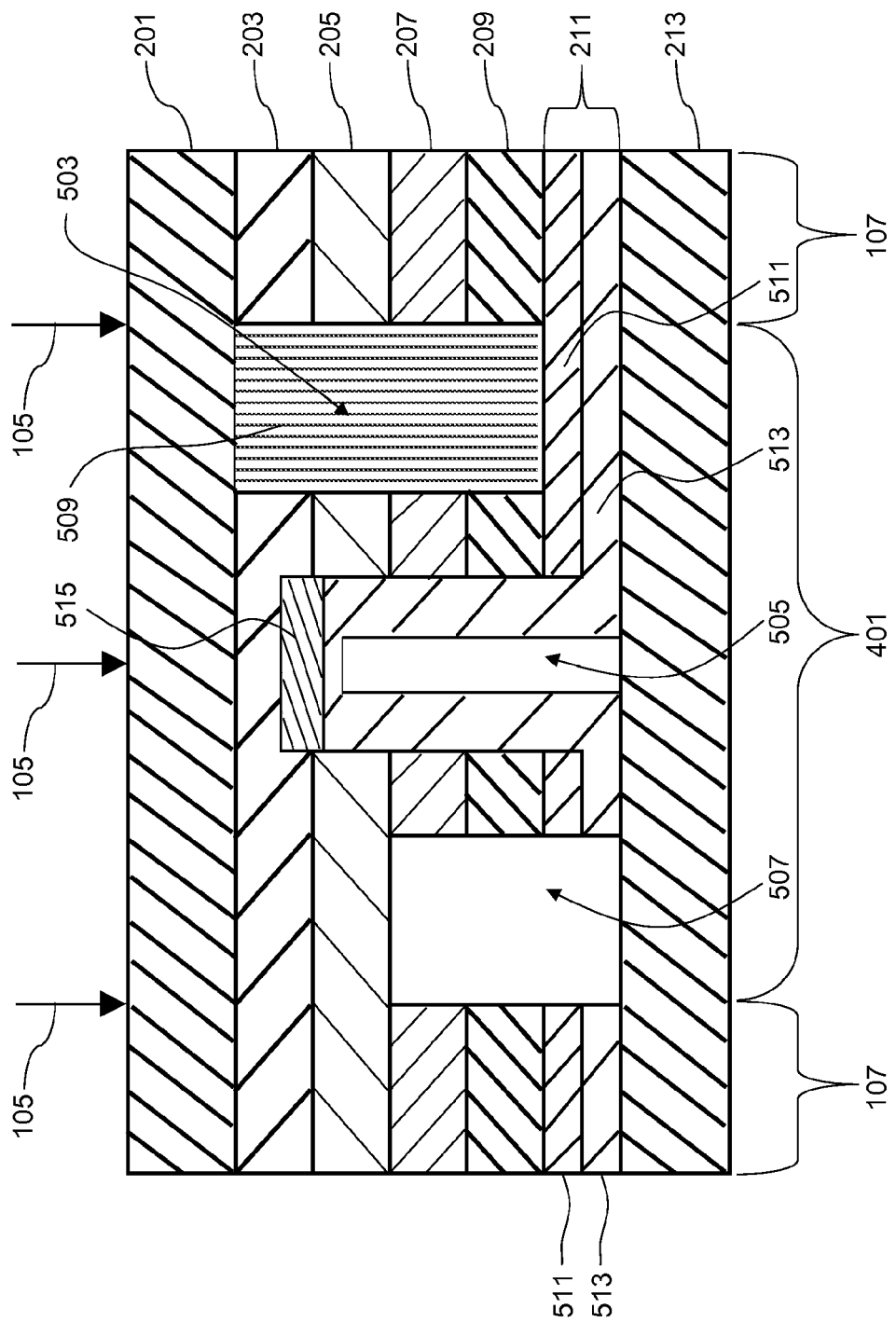
FIG. 5 shows a sectional view taken in direction 5-5 of FIG. 4.

FIG. 5 illustrates a sectioned view of an exemplary film stack for interconnection 401 taken in direction 5-5 of FIG. 4. As shown in FIG. 5, interconnection 401 includes structures formed between cells 107. As shown in FIG. 5, interconnection 401 includes a first scribe 503, a second scribe 505, and a third scribe 507. First scribe 503, second scribe 505 and third scribe 507 of interconnection 401 are formed during the formation of cell 107 (see method of FIG. 3). In addition, selectively deposited thin film structure 515 is adjacent first conductive layer 203. The present disclosure is not limited to the selectively deposited thin film structure 515 being adjacent to the first conductive layer 203 and may include arrangements wherein first conductive layer 203 includes the selectively deposited thin film structure 515 and/or is chemically or mechanically converted to a selectively deposited thin film structure 515.

Figure 6:
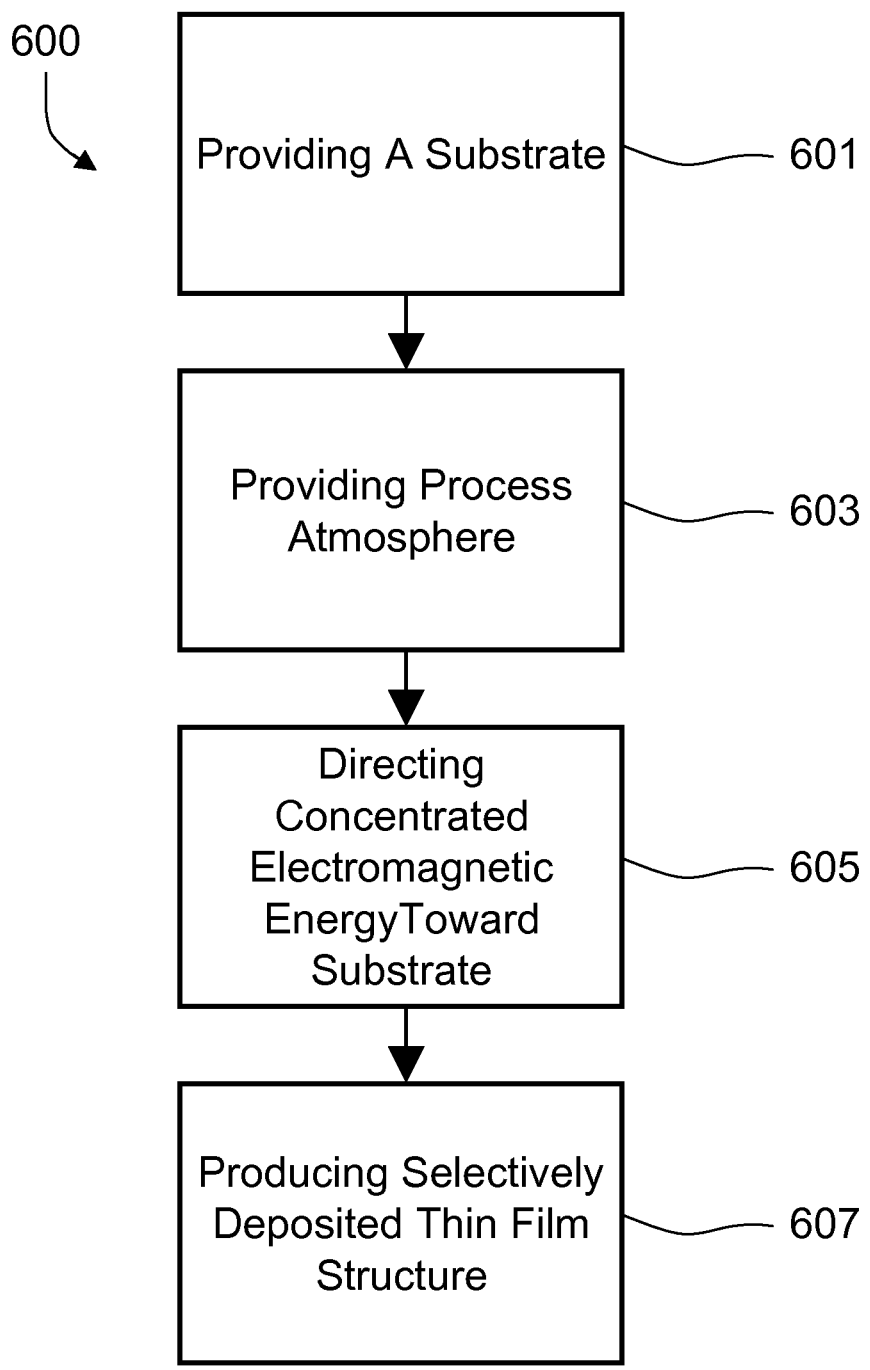
FIG. 6 is a process flow diagram of an exemplary process for forming a selectively deposited thin film structure.

FIG. 6 includes a flowchart illustrating an exemplary method 600 for forming the selectively deposited thin film structure 515. The method includes providing a substrate (box 601). The substrate may be superstrate 201. In one embodiment, suitable substrates may include high-transmission, low-iron float glass or any other suitable glass material having a high transmission rate for light 105. In another embodiment, the substrate may be a high transmission borosilicate glass.

As shown in FIG. 6, method 600 further includes providing a process atmosphere (box 603). Process 600 may include gas capable of decomposing to form a metallic or metal compound structure. Suitable process gasses include, for example, organometallic gases, such as tin tetrachloride, dimethyl cadmium, dimethyl zinc or combinations thereof. Multiple process gasses allow for multi-component materials, such as binary or multi-component semi-conductors, to be deposited onto the substrate. The process gas may include other additives, such as $O_2$, $Cl_2$, reducing agents or reducing gasses to provide desirable decomposition and desirable structures when the selectively deposited thin film structure 515 is formed. The process conditions may include high pressures in an inert or reactive atmosphere or under low pressures.

As shown in FIG. 6, concentrated electromagnetic energy 703 from an energy source 701 (see for example FIG. 7), such as a laser, is directed toward the reducible material (box 605). The laser or other energy source is a device that is configured with a power density and/or wavelength that provides heat and energy to the substrate. The area adjacent the substrate where concentrated electromagnetic energy contacts the substrate in the process atmosphere includes conditions that facilitate decomposition of the process gas to form the selectively deposited thin film structure 515 (box 607). By "selective," "selectively" or other grammatical variations thereof, it is meant that the deposition or decomposition is provided at a position at a time that is controlled and can be altered. The selective deposition may be provided by the localized heating resulting from the concentration of energy resulting from the directing of the concentrated electromagnetic energy 703 from the energy source. For example, concentrated electromagnetic energy 703 having a predetermined beam width may be utilized to track across the surface of the substrate to create a desired pattern for the decomposed process gas. The pattern resulting may be such that the thin film structures are formed to isolate or form thin film structures. In one embodiment, the decomposition of the process gas is provided on a superstrate of a thin film PV cell 107, wherein the pattern formed corresponds to the dead areas of the PV modules 100. The decomposed process gas positioned in the dead areas are less transparent, but may be metallic and have a greater conductivity, which increases the efficiency of the PV module 100.

In one embodiment, the selectively deposited thin film structure 515 is a metal or metallic compound. In certain embodiments, the selectively deposited thin film structure 515 may include indium, cadmium, tin, zinc, and combinations thereof. The decomposition may include metal-organic chemical vapor deposition (MOCVD) accomplished by exposing the heated substrate to an organo-metallic gaseous molecule in the process gas. Upon contacting the substrate, the organo-metallic molecule decomposes in isolated areas. The result of the decomposition is that the metal atom is deposited onto the substrate. The remainder of the organic molecule is pumped out of the chamber. A MOCVD process may be augmented by heating the substrate locally with a laser. The organo-metallic molecule will decompose where the substrate is heated, thus allowing for a patterned deposition of the material. Upon completion of the process, the remaining process gas or the decomposed molecule may be pumped/purged (depending upon pressure) out of the chamber.

Figure 7:
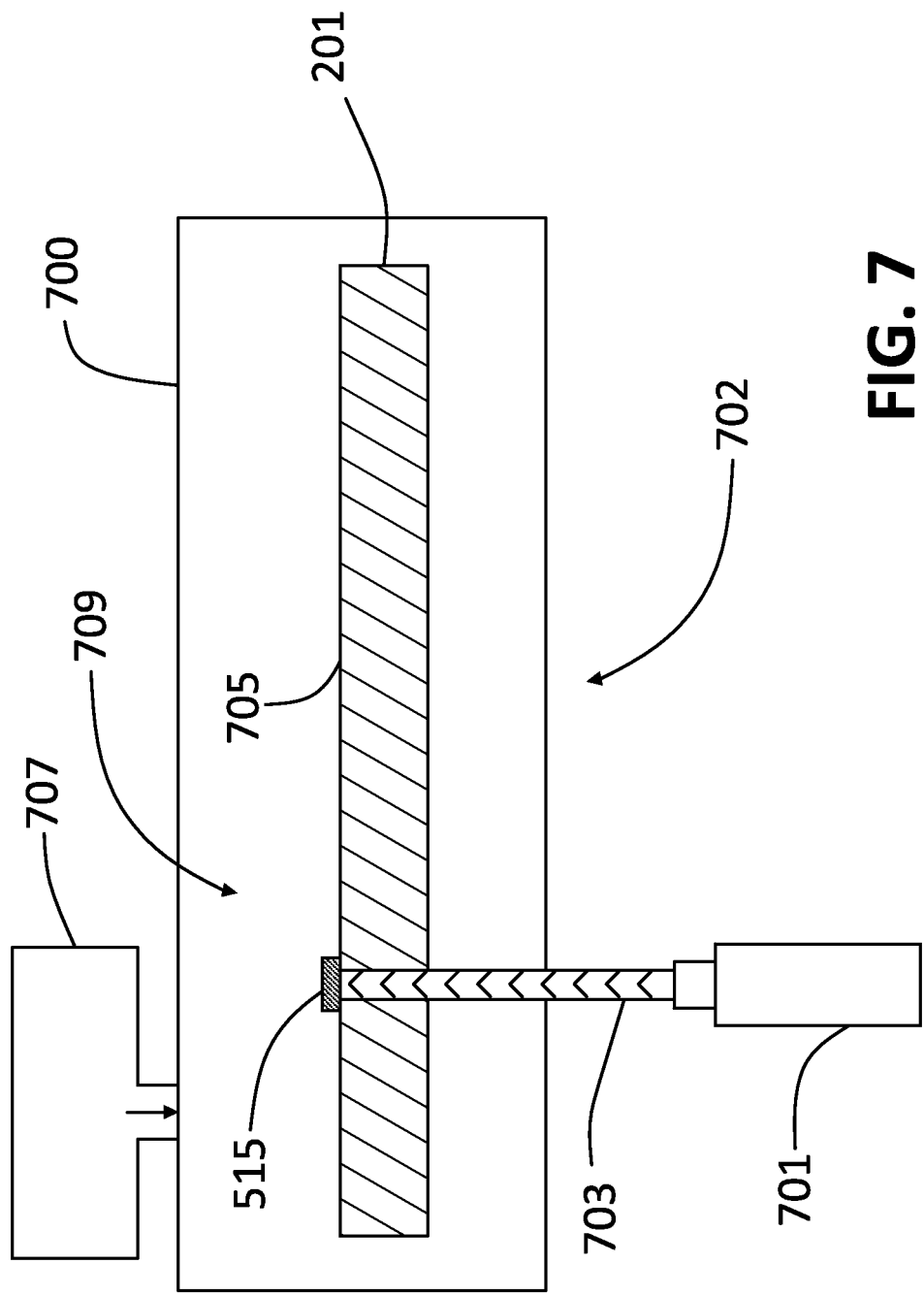
FIG. 7 is an apparatus for forming a selectively deposited thin film structure according to the disclosure.

FIG. 7 illustrates an apparatus 702 for forming the selectively deposited thin film structure 515 as shown and described in FIG. 6. As shown in FIG. 7, an energy source 701 emits concentrated electromagnetic energy 703 or a beam that is directed at surface 705 of superstrate 201. The concentrated electromagnetic energy 703 includes energy that is concentrated so that the energy may be directed and is capable of providing energy and/or heat to a specific area of a material remote from the energy source 701. Energy source 701 may be an energy source capable of providing sufficient heat to the surface of superstrate 201 to at least partially decompose process gas 709. Although energy source 701 is shown below the superstrate 201, superstrate 201 can be exposed to the energy from above or below the superstrate 201. The process may be performed in a chamber 700 that is capable of providing process gas 709 at surface 705. Chamber 700 may be a vacuum or may be purged with an inert gas. One or more process gasses 709 including organo-metallic molecules may flow into the chamber. Process gas 709 may be provided to process chamber 700 from a process gas source 707. When concentrated electromagnetic energy 703 contacts surface 705 in the presence of process gas 709, process gas 709 may be at least partially decomposed to form a selectively deposited thin film structure 515.

Figure 8:
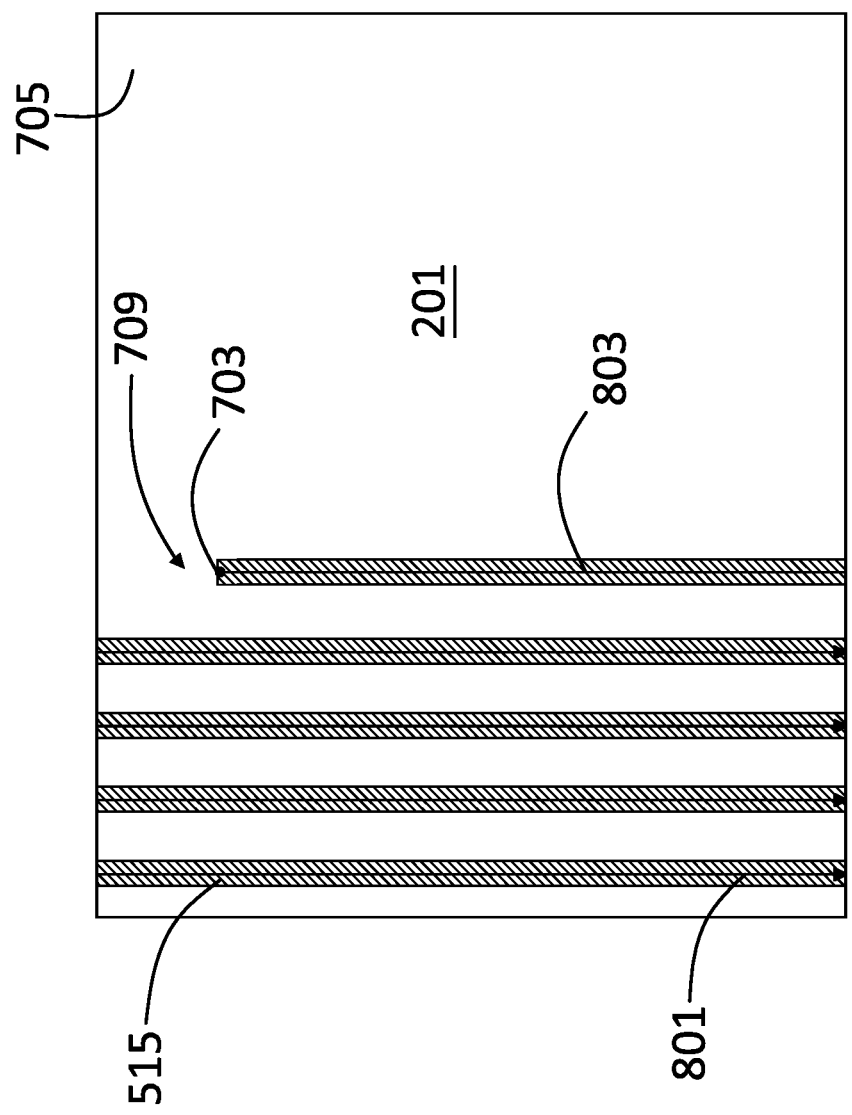
FIG. 8 shows an exemplary method for performing the method according to the disclosure.

FIG. 8 shows a top view of a superstrate 201, being subjected to the method of the present disclosure. As shown, concentrated electromagnetic energy 703 is traced along path 801 locally heating the surface 705 of superstrate 201 in the presence of process gas 709 (see also FIG. 7). After the beam of concentrated electromagnetic energy 703 heats the surface, the process gas 709 decomposes onto surface 705 and forms selectively deposited thin film structure 515. The embodiment shown in FIG. 8 includes a path 801 that traces back and forth across the surface 705 in a direction 803. The deposition of the selectively deposited thin film structure 515 is controlled such that the selectively deposited thin film structure 515 is deposited only along the path 801. The path 801 of concentrated electromagnetic energy 703 is not so limited and may include any suitable path 801 for concentrated electromagnetic energy 703.

Figure 9:
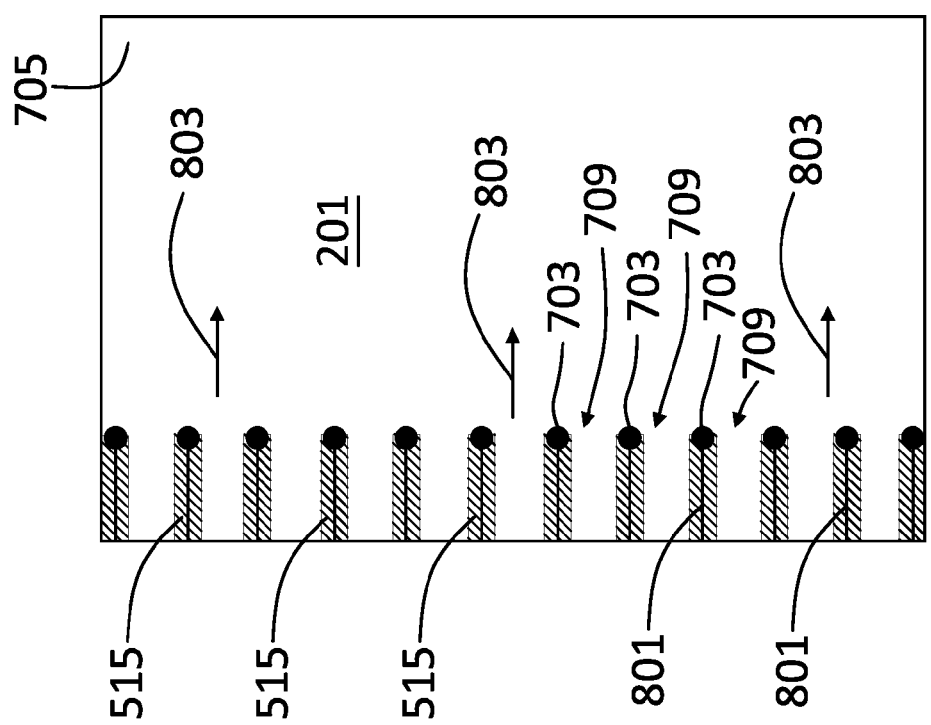
FIG. 9 shows another exemplary method for performing the method according to the disclosure.

FIG. 9 shows a top view of a superstrate 201 according to an alternate arrangement. As shown in FIG. 9, plurality of beams of concentrated electromagnetic energy 703 are utilized to form selectively deposited thin film structure 515 simultaneously along the surface 705 in the presence of process gas 709. In this embodiment, the beams of concentrated electromagnetic energy 703 may provide the treatment in a single pass in direction 803, which reduces the process time required. Like in the embodiment of FIG. 8, the selectively deposited thin film structure 515 is formed along path 801 of beams of concentrated electromagnetic energy 803.

Figure 10:
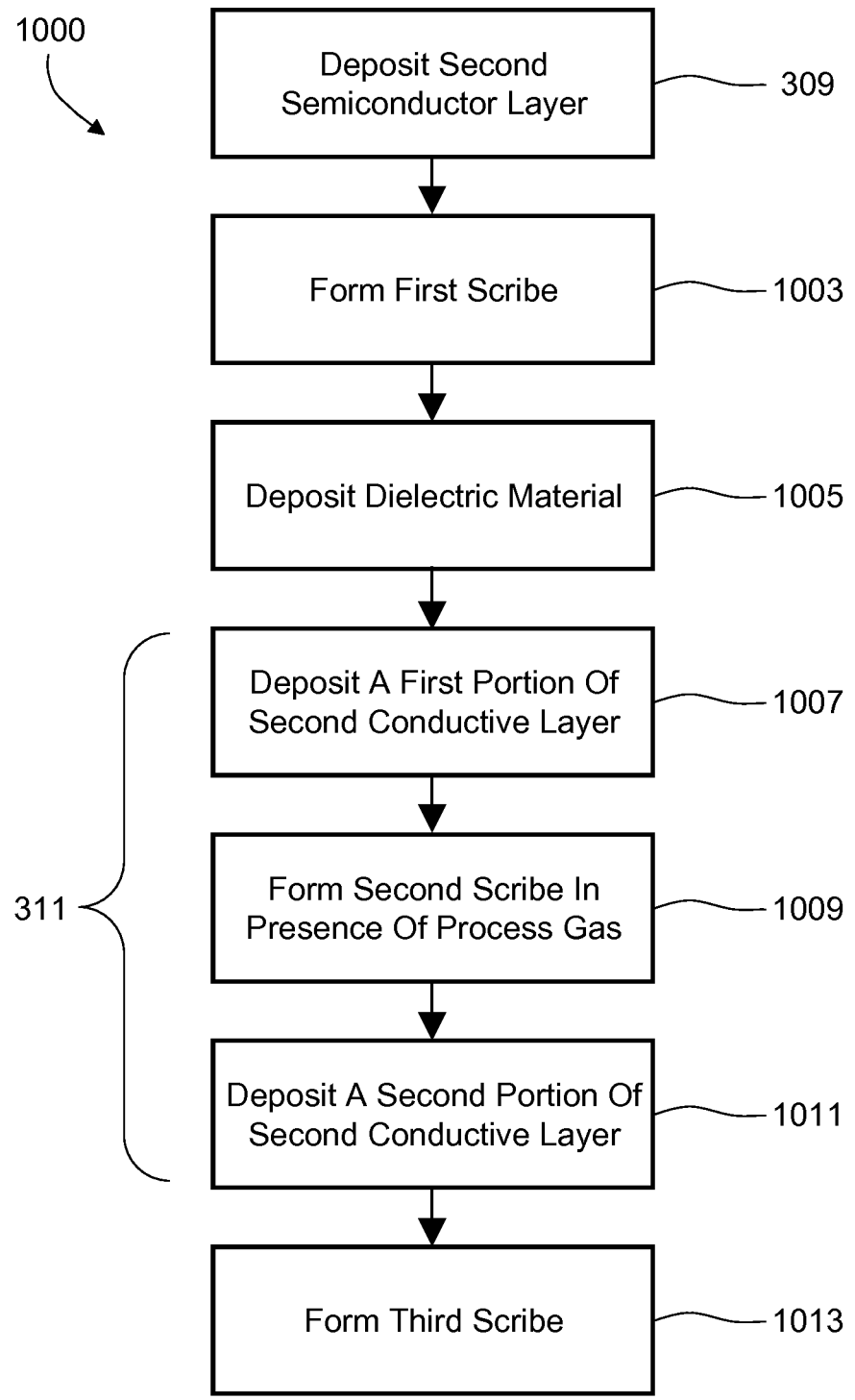
FIG. 10 is a process flow diagram for an alternate exemplary process for forming a selectively deposited thin film structure.

FIG. 10 includes a flowchart illustrating an exemplary method 1000 for forming interconnection 401. Method 1000 includes depositing second semiconductor layer 209 (box 309), as shown and described with respect to box 309 of FIG. 3. Specifically, first scribe 503 may be formed (box 1003) subsequent to the deposition of the second semiconductor layer 209 and may be formed by directing concentrated electromagnetic energy through superstrate 201 to selectively remove the layers present thereon. Suitable energy sources 701 may include a laser source, a radio frequency (Rf) course, an electron beam source, an ion beam source, an infrared (IR) source and/or a source for rapid thermal process (RTA). In another embodiment, first scribe 503 may be formed by chemical processes, such as photolithography. To provide electrical isolation, first scribe 503 is filled with dielectric material (box 1005). Suitable dielectric materials may include, but are not limited to a negative photo resist or other suitable dielectric material.

Method 1000 for forming interconnection 401 may further include formation of second scribe 505 during the deposition of second conductive layer 211 (box 311 of FIG. 3). Formation (box 311) of second scribe 505 may include depositing a first portion 511 of second conductive material 211 (box 1007). First portion 511 may include any suitable conductive material. Suitable first portion 511 may include, for example, graphite. After first portion 511 is formed, second scribe 505 may be formed by directing an energy source 701, such as a laser, through superstrate 201 to selectively remove the layers present thereon (box 1009). The energy source 701 may be any suitable energy source and may include the same or different source utilized to form first scribe 503. Subsequent to formation of second scribe 505, second portion 513 of second conductive layer 211 is provided (box 1011). Second portion 513 may be any suitable conductive material and may include, for example, metal alloys, such a Ni and Al containing alloys. In one embodiment, first portion 511 comprising graphite is provided prior to the second scribe 505 and a second portion 513 comprising metal is provided after the second scribe 505 is formed. In addition to providing the second portion 513 to the cell 107, second portion 513 may be deposited onto surfaces formed by the second scribe 505 (box 1011). Since second portion 513 of second conductive layer 211 is electrically conductive, second portion 513 electrically connects first conductive layer 203 and buffer layer 205 to second conductive layer 211. This connection (upon isolation with third scribe 507) places the cells 107 into a series arrangement.

Third scribe 507 may be formed subsequent to the deposition of the second conductive material 211 (box 1013). Third scribe 507 may be formed by directing an energy source 701 onto the layers from the direction opposite the superstrate 201 to selectively remove the layers present thereon. The energy source 701 may be any suitable energy source and may include the same or different source utilized to form first scribe 503 and/or second scribes 505. Third scribe 507 severs first conductive layer 203, first semiconductor layer 207 and second semiconductor layer 209, but permits buffer layer 205 and first conductive layer 203 to remain (see e.g., FIG. 5). The arrangement of module 100 remaining after third scribe 507 may be a series arrangement of cells 107.

Second scribe 505 formed after the deposition of first portion 511 of second conductive material 211 (see box 1009 in FIG. 10) results in a space that extends to first conductive layer 203 (see e.g., FIG. 5). In one embodiment, selectively deposited thin film structure 515 may be formed on first conductive layer 203. The selectively deposited thin film structure 515 is an area in which the material of the first conductive layer 203 is deposited by decomposition of the process gas 709.

Figure 11:
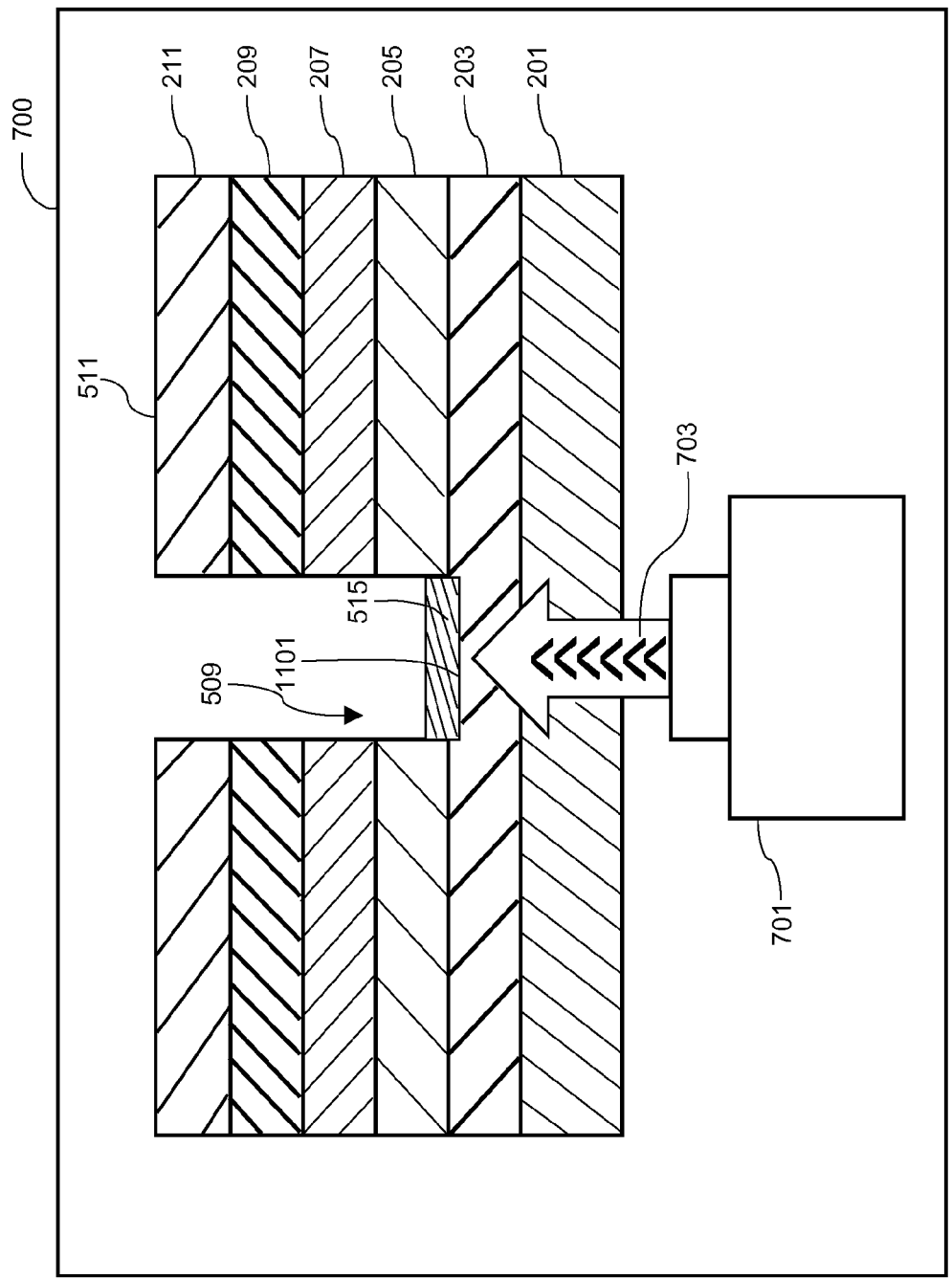
FIG. 11 is an apparatus forming a selectively deposited thin film structure according to another embodiment of the disclosure.

FIG. 11 shows another embodiment of a selectively deposited thin film structure 515 being formed (box 607 of FIG. 6). Specifically, FIG. 11 shows an apparatus forming second scribe 505. In this embodiment, the energy source 701 includes concentrated electromagnetic energy 703 that is directed through superstrate 201, wherein first portion 511 of first conductive layer 203, buffer layer 205, first semiconductor layer 207, and second semiconductor layer 209, are selectively removed. Concentrated electromagnetic energy 703 provides heat and/or energy to surface 1101 of first conductive layer 203. In addition, a reducing atmosphere is present with a process gas 709 provided at surface 1101, thereby forming the selectively deposited thin film structure 515 on first conductive layer 203. The selectively deposited thin film structure 515 in one embodiment includes a conversion of the first conductive layer 203 to a material that is more electrically conductive than the first conductive layer 203.

While the above has been described with respect to PV modules and PV devices, the method, thin film structure and apparatus of the present disclosure are usable with other thin film devices. Other thin film devices usable with the present disclosure include, but are not limited to photo detectors, diode application, or thin film displays.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A method for selectively depositing a thin film structure on a substrate, the method comprising:
    depositing a plurality of thin film layers on the substrate, the thin film layers including a first conductive layer, a first semiconductor layer, and a second semiconductor layer;
    providing a process gas at the plurality of thin film layers;
    directing concentrated electromagnetic energy from a source of energy towards the plurality of thin film layers;
    forming a scribe line in the plurality of thin film layers with the concentrated electromagnetic energy, the scribe line extending through at least a portion of the first semiconductor layer and the second semiconductor layer; and
    decomposing the process gas with the concentrated electromagnetic energy to form a selectively deposited thin film structure on the substrate within the scribe line.

2. The method of claim 1, further comprising:
    depositing a first portion of a second conductive layer onto the second semiconductor layer prior to said step of directing; and depositing a second portion of the second conductive layer onto the first portion of the second conductive layer after said step of decomposing.

3. The method of claim 2, wherein the first portion of the second conductive layer comprises graphite.

4. The method of claim 3, further comprising:
depositing a second conductive layer onto the second semiconductor layer; and
forming a third scribe line in the plurality of thin film layers after said step of directing, the third scribe line extending through at least a portion of the first semiconductor layer, the second semiconductor layer, and the second conductive layer.

5. The method of claim 2, wherein the second portion of the second conductive layer comprises metal alloy.

6. The method of claim 1, wherein the scribe line is a second scribe line;
the method further comprising:
forming a first scribe line in the plurality of thin film layers prior to said step of directing, the first scribe line extending through at least a portion of the first conductive layer, the first semiconductor layer, and the second semiconductor layer.

7. The method of claim 6, wherein the thin film structure includes a metal selected from the group consisting of indium, cadmium, tin, zinc and combinations thereof.

8. The method of claim 1, wherein the thin film structure comprises a metal.

9. The method of claim 8, wherein the organometallic gas is selected from the group consisting of tin tetrachloride, dimethyl cadmium, dimethyl zinc, trimethyl indium and combinations thereof.

10. The method of claim 1, wherein the process gas is an organometallic gas.

11. The method of claim 1, wherein the source of energy is selected from the group consisting of laser, radio frequency, electron beam, ion beam, infrared source and combinations thereof.

12. The method of claim 11, wherein the plurality of thin films further comprises a buffer layer between the first conductive layer and the first semiconductor layer.

13. The method of claim 1, wherein the thin film structure has a greater conductivity than the first conductive layer.

14. The method of claim 1, wherein the first conductive layer is on the substrate, the first semiconductor layer is on the first conductive layer, and the second semiconductor layer is on the first semiconductor layer.

15. A method for selectively depositing a thin film structure on a substrate, the method comprising:
depositing a plurality of thin film layers on the substrate, the thin film layers including a transparent conductive oxide (TCO) layer, a cadmium sulfide (CdS) layer, and a cadmium telluride (CdTe) layer;
providing an organometallic process gas at the plurality of thin film layers;
directing concentrated electromagnetic energy from a source of energy towards the plurality of thin film layers;
forming a scribe line in the plurality of thin film layers with the concentrated electromagnetic energy, the scribe line extending through at least a portion of the CdS layer and the CdTe layer; and
decomposing the organometallic process gas with the concentrated electromagnetic energy to form a selectively deposited thin film structure on the TCO layer, wherein the selectively deposited thin film structure comprises a metal.

* * * * *